(12) United States Patent
Sewell (10) Patent No.: US 7,154,669 B2
(45) Date of Patent: Dec. 26, 2006

(54) METHOD AND SYSTEM FOR CORRECTION OF INTRINSIC BIREFRINGENCE IN UV MICROLITHOGRAPHY

(75) Inventor: Harry Sewell, Ridgefield, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 10/304,995

(22) Filed: Nov. 27, 2002

(65) Prior Publication Data

US 2004/0021943 A1 Feb. 5, 2004

Related U.S. Application Data

(60) Provisional application No. 60/400,680, filed on Aug. 5, 2002.

(51) Int. Cl.
G02B 5/30 (2006.01)
(52) U.S. Cl. .................. 359/499; 359/494; 359/357
(58) Field of Classification Search ............ 359/499, 359/355, 352, 357, 483, 485, 494, 497, 500
See application file for complete search history.

(56) References Cited

U.S. PATENT DOCUMENTS

| 5,220,454 A | 6/1993 | Ichihara et al. ............ 359/487 |
| 6,683,710 B1 * | 1/2004 | Hoffman et al. ........... 359/256 |
| 6,697,199 B1 * | 2/2004 | Gerhard et al. ............ 359/499 |
| 6,831,731 B1 * | 12/2004 | Omura et al. ................ 355/67 |
| 2003/0025894 A1 * | 2/2003 | Owa et al. .................... 355/67 |
| 2003/0063393 A1 * | 4/2003 | Omura ........................ 359/649 |

FOREIGN PATENT DOCUMENTS

EP 1 316 848 A2 6/2003

WO WO 03/009062 A1 1/2003

OTHER PUBLICATIONS

U.S. Appl. No. 60/296,694.*
U.S. Appl. No. 60/295,212.*
U.S. Appl. No. 60/299,603.*
U.S. Appl. No. 60/299,497.*
Burnett et al., "Minimizing Spatial-Dispersion-Induced Birefringence in Crystals for Precision Optics by Using Mixed Crystals of Materials with the Opposite Sign of the Birefringence," *Physics Laboratory—Atomic Physics Division*, internet address: http://physics.nist.gov/Divisions/Div842/Gp3/DUVMatChar/birefring.html, dated: Mar. 26, 2002, 4 pages.
Burnett et al., "$Ca_{1-x}Ba_xF_2$ and $Ca_{1-x}Sr_xF_2$ Mixed Crystals as Potential Solution to Intrinsic Birefringence Problem for 157nm Lithography," *SEMATECH 157nm Technical Data Review*, Dec. 11, 2001, Orlando, Florida.
Nonogaki et al., "Microlithography Fundamentals in Semiconductor Devices and Fabrication Technology," pp. iii-v and 1-24, Marcel Dekker,Inc., 1998.
Chernevskaya et al., "Structure of Mixed Crystals Based on $CaF_2$, $SrF_2$, and $BaF_2$," *Soviet Physics—Solid State*, vol. 8, No. 1, Jul. 1966, pp. 169-171.
News Room, "International Sematech Workshop on Calcium Fluoride Birefringence Sees No Technical Showstoppers," *International Sematech, Inc.*, Jul. 18, 2001, 2 pages.
Aaron Hand, Managing Editor, "157 nm Optics Demand a Bag of Tricks," *Semiconductor International*, pp. 1-6, Feb. 1, 2002.

(Continued)

*Primary Examiner*—Arnel C. Lavarias
(74) *Attorney, Agent, or Firm*—Sterne, Kessler, Goldstein & Fox, P.L.L.C.

(57) ABSTRACT

Systems and methods for improved correction of intrinsic birefringence are provided. Two pairs of optical elements correct for intrinsic birefringence of optical materials. A combination of design criteria for the set of optical elements, including refractive power type, intrinsic birefringence signs, and crystal axis rotation, is used to correct for intrinsic birefringence.

22 Claims, 4 Drawing Sheets

OTHER PUBLICATIONS

Burnett et al., "Minimizing Spatial-Dispersion-Induced Birefringence in Crystals Used for Precision Optics by Using Mixed Crystals of Materials with the Opposite Sign of the Birefringence," *Physics Laboratory—Atomic Physics Division*, pp. 1-2, Dec. 7, 2001.

Burnett et al., "Intrinsic Birefringence in Calcium Fluoride Forces Optical Engineers to use Sophisticated Design Techniques for 157-nm Lithography Objectives," *OE Magazine*, Mar. 2002, 3 pages.

Burnett et al., "Symmetry of Spatial-Dispersion-Induced Birefringence and Its Implications for $CaF_2$ Ultraviolet Optics," *J. Microlith., Microfab., Microsyst*, vol. 1, No. 3, Oct. 2002, pp. 213-224.

Dana, Stephane, "Pushing The Limits," *Spie's OE Magazine*, Mar. 2002, pp. 20-21.

vCopy of International Search Report for Appl. No. PCT/US03/24063, issued Nov. 26, 2003, 4 pages.

John H. Burnett et al., "Intrinsic birefringence in calcium fluoride and barium fluoride," 4 pages, *Physical Review B*, vol. 64, 241102(R), Nov. 29, 2001.

http://physics.nist.gov/Divisions/Div842/Gp3/DUVMatChar/slice.html, "Intrinsic Birefringence," *NIST Atomic Phys. Div: DUV Figures*, 2 pages, downloaded Nov. 11, 2002.

http://physics.nist.gov/Divisions/Div842/Gp3/DUVMatChar/157nmTable.html, "Absolute Index, Dispersion, and Temperature Dependence of LiF, $CaF_2$, $SrF_2$, and $BaF_2$, near 157 nm*," *Absolute refractive indices and thermal coefficients near 157 nm*, 2 pages, downloaded Nov. 11, 2002.

http://physics.nist.gov/Divisions/Div842/Gp3/DUVMatChar/DUVrefract.html, "Plasma Radiation Group—DUV Sources and Materials Characterization," *NIST Atomic Phys. Div: DUV Index of Refraction*, 1 page, downloaded Nov. 11, 2002.

http://physics.nist.gov/Divisions/Div842/Gp3/DUVMatChar/index.html, "Plasma Radiation Group—DUV Sources and Materials Characterization," *NIST Atomic Phys. Div: DUV Sources and Materials Character*, 2 pages, downloaded Nov. 11, 2002.

Nogawa, H., et al, "System Design of a 157nm Scanner", Optical Microlithography XV, Anthony Yen, Editor, Proceedings of SPIE vol. 4691 (2002), pp. 602-612.

* cited by examiner

METHOD AND SYSTEM FOR CORRECTION OF INTRINSIC BIREFRINGENCE IN UV MICROLITHOGRAPHY

This application claims the benefit of U.S. Provisional Application No. 60/400,680, filed Aug. 5, 2002 (incorporated by reference herein in its entirety).

BACKGROUND OF THE INVENTION

1. Field of the Invention

The present invention pertains to optics, and in particular, to optics in microlithography.

2. Background Art

Photolithography (also called microlithography) is a semiconductor fabrication technology. Photolithography uses ultraviolet (UV) or visible light to generate fine patterns in a semiconductor device design. Many types of semiconductor devices, such as, diodes, transistors, and integrated circuits, can be fabricated using photolithographic techniques. Exposure systems or tools are used to carry out photolithographic techniques, such as etching, in semiconductor fabrication. An exposure system can include a light source, reticle, optical reduction system, and a wafer alignment stage. An image of a semiconductor pattern is printed or fabricated on the reticle (also called a mask). A light source illuminates the reticle to generate an image of the particular reticle pattern. An optical reduction system is used to pass a high-quality image of the reticle pattern to a wafer.

Integrated circuit designs are becoming increasingly complex. The number of components and integration density of components in layouts is increasing. Demand for an ever-decreasing minimum feature size is high. The minimum feature size (also called line width) refers to the smallest dimension of a semiconductor feature that can be fabricated within acceptable tolerances. As a result, it is increasingly important that photolithographic systems and techniques provide a higher resolution.

One approach to improve resolution is to shorten the wavelength of light used in fabrication. Increasing the numerical aperture (NA) of the optical reduction system also improves resolution. Indeed, commercial exposure systems have been developed with decreasing wavelengths of light and increasing NA. For example, UV exposure systems are available from ASML, Inc. which have light sources operating at a wavelength of 248 nanometer (nm) with an associated NA of 0.5 or 0.6, at a wavelength of 193 nm with an associated NA of 0.5 or 0.6, and at a wavelength of 157 nm with an associated NA of 0.75.

In UV microlithography, it is important to maintain a high light transmissivity through an optical reduction system with little or no loss. Exposure time and the overall semiconductor fabrication time depends upon the intensity or magnitude of light output onto the wafer. An optical reduction system must also output a sharp focused image of a mask onto a wafer. This ensures that the fine detail needed for semiconductor fabrication is preserved.

As the exposure wavelength decreases, an optical reduction system must include optical components, such as, lenses, which are made of a material which is transparent even at low UV wavelengths such as 193 nm and 157 nm. Examples of such optical materials include calcium fluoride (CaF2) and barium fluoride (BaF2). These optical materials, however, have a relatively high degree of intrinsic birefringence (also called spatial-dispersion-induced birefringence). This high intrinsic birefringence is very direction dependent. As a result, the optical characteristics of the optical material (such as transmissivity and refraction) vary unevenly across a beam incident on the optical material. In other words, because of the directional dependence of the intrinsic birefringence, some parts of a beam spot may be sped up or slowed down relative to other parts of the beam spot depending the polarization of light at the different parts of the beam spot. In demanding applications like microlithography, such intrinsic birefringence is undesirable as it can blur or reduce the sharpness of an image, or cause loss of light through an optical reduction system.

One approach to correcting intrinsic birefringence is to use a single pair of optical elements rotated relative to one another. For a single pair of lenses having a <100> crystal orientation, the optical axis of the crystal structure of one lens in the pair is rotated at an angle relative to the optical axis of the crystal structure of other lens. Such correction of intrinsic birefringence is limited, especially in high-quality applications like photolithography.

What is needed is an even superior approach for correcting intrinsic birefringence than a pair of optical elements. This is especially needed in optical reduction systems used in low UV microlithography applications.

BRIEF SUMMARY OF THE INVENTION

The present invention provides a system and method for improved correction of intrinsic birefringence. Two pairs of optical elements are used to correct intrinsic birefringence according to the present invention. The type of refractive power and the sign of the intrinsic birefringence of the pairs of optical elements are balanced or selected to correct for intrinsic birefringence. In embodiments, two pairs of optical elements include opposite refractive powers (positive and negative), and same sign intrinsic birefringence values (positive or negative). In other embodiments, the pairs of optical elements have the same type of refractive powers (positive or negative), while intrinsic birefringence values have different signs (positive and negative). Also, within each pair, the optical elements are arranged such their crystal axes are rotated by an angle that nulls intrinsic birefringence. In examples, this angle is approximately 45 or 60 degrees depending upon whether crystal structure of the material used in the optical elements has four fold or three fold symmetry, respectively.

This combination of crystal axis rotation, same or different sign intrinsic birefringence values (or refractive indices), and same or different refractive power provides an improved correction of intrinsic birefringence compared to a single pair of rotated optical elements used in conventional approaches. An improved correction or nulling of intrinsic birefringence is especially important in UV microlithography where optical materials with a high degree of intrinsic birefringence, such as, calcium fluoride and barium flouride, are desired to be used.

In one embodiment, first and second pairs of optical elements are disposed along an optical axis. The first pair includes a first optical element made up of a first material having a first intrinsic birefringence value and a first crystal axis, and a second optical element made up of a second material having a second intrinsic birefringence value and a second crystal axis. The second pair includes a third optical element made up of a third material having a third intrinsic birefringence value and a third crystal axis, and a fourth optical element made up of a fourth material having a fourth intrinsic birefringence value and a fourth crystal axis.

To correct the intrinsic birefringence in the optical materials of these optical elements, the first pair of optical elements has a positive refractive power, and the second pair of optical elements has a negative refractive power. In one example implementation, the first pair of optical elements are two double convex lenses having a positive refractive power, while the second pair of optical elements are two double concave lenses having a negative refractive power. These lenses making up the two pairs can be arranged in any order along an optical axis. The first and second intrinsic birefringence values of the first and second optical elements have the same sign as the third and fourth intrinsic birefringence values of the third and fourth optical elements. The first and second optical elements are rotated with respect to one another such that the first crystal axis and the second crystal axis form an angle of approximately 45 or 60 degrees. The third and fourth optical elements are rotated with respect to one another such that the third crystal axis and the fourth crystal axis form an angle of approximately 45 or 60 degrees.

According to one embodiment, the first to fourth optical materials are fluoride materials including, but not limited to, calcium fluoride and barium fluoride. The fluoride material in the four optical elements can have a <100> crystal orientation, a <111> orientation, or other known orientation. Such fluoride materials are transparent for UV wavelengths, such as, 193 nm and 157 nm, but have a high degree of intrinsic birefringence. Fluoride material with a <111> or <100> crystal orientation has three or four fold symmetry respectively. One advantage of the present invention is that each pair of elements acts to change the three or four fold symmetry to a cylindrical symmetry. This cylindrical symmetry further helps radially even out light and correct for intrinsic birefringence.

According to another embodiment, the signs of intrinsic birefringence values of the first pair of optical elements and the second pair of optical elements are different (positive and negative). The refractive powers of the first and second pairs of elements then can be the same (positive or negative). The first and second optical elements are rotated with respect to one another such that the first crystal axis and the second crystal axis form an angle of approximately 45 or 60 degrees depending upon whether crystal structure in the optical elements has a four fold or three fold symmetry respectively. Likewise, the third and fourth optical elements are rotated with respect to one another such that the third crystal axis and the fourth crystal axis form an angle of approximately 45 or 60 degrees depending upon whether crystal structure in the optical elements has a four fold or three fold symmetry.

According to a further feature, an optical system corrected for intrinsic birefringence is used in UV microlithography. In one embodiment, an optical system corrected for intrinsic birefringence according to the present invention is provided as part of an optical reduction system in a microlithography exposure system.

The present invention also provides methods for correcting for intrinsic birefringence. In one embodiment, a method for correcting for intrinsic birefringence includes the step of disposing two pairs of birefringence-compensating optical elements along an optical path. One of the two pairs has a positive refractive power and the other pair has a negative refractive power. The two pairs also have same sign intrinsic birefringence values and a relative angle of crystal axis rotation that nulls (i.e., evens out radially) intrinsic birefringence.

In another embodiment, a method for correcting for intrinsic birefringence includes the step of disposing two pairs of birefringence-compensating optical elements along an optical path. One of the two pairs has optical elements with a positive sign intrinsic birefringence value, and the other pair has optical elements with a negative sign intrinsic birefringence value. The two pairs also have the same type of refractive power (positive or negative) and a relative angle of crystal axis rotation that nulls (i.e., evens out radially) intrinsic birefringence.

In another embodiment, a semiconductor fabrication method for exposing a wafer with an image representative of a pattern on a mask includes the steps of illuminating the mask with an exposure light, and projecting and reducing the exposure light transmitted from the illuminated mask toward the wafer. The projecting and reducing step includes correcting for intrinsic birefringence at two locations in the optical path. Such correcting can include passing light through two pairs of birefringence-compensating optical elements.

In another embodiment, a semiconductor fabrication method includes the steps of illuminating a mask with an exposure light to obtain an image representative of the pattern, and reducing the image representative of the pattern with a set of optical elements. The reducing step includes correcting for intrinsic birefringence along an optical path based on a combination of design criteria for the set of optical elements including: negative and positive refractive power, negative and positive sign intrinsic birefringence values, and crystal axis rotation.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the present invention would be of significant utility.

Overview

The present invention provides systems and methods for improved correction of intrinsic birefringence. The present invention can be used in any optical system or application including, but not limited to, microlithography. A set of four optical elements (also referred to herein as two pairs of optical elements) are used to correct intrinsic birefringence. A combination of crystal axis rotation, type of refractive power, and type of intrinsic birefringence sign (or refractive indices) in the set of two pairs of optical elements, provides an improved correction or nullification of intrinsic birefringence compared to a single pair of rotated optical elements.

Terminology

To more clearly delineate the present invention, an effort is made throughout the specification to adhere to the following term definitions consistently.

The term "optical element" refers to any element that can be used in an optical system. An optical element can be include, but is not limited to, any type of lens, such as, a double convex lens, a plano-convex lens, a convex-plano lens, a double concave lens, a piano-concave lens, a concave-plano lens, shell, or plate.

The term "pair of birefringence-compensating optical elements" refers to a pair of optical elements having crystal axes arranged such that the crystal axes are rotated by an angle with respect each other to correct for birefringence. The angle depends upon the type of material such as calcium fluoride, barium fluoride, or selenium fluoride. In one example where calcium fluoride is used, the angle is equal to approximately 60 degrees for <111> orientation with three fold symmetry and 45 degrees for <100> orientation with four fold symmetry; however, other angles can be used as needed to correct for birefringence in a particular application.

Intrinsic Birefringence Correction for UV Optical System

Figure 1:
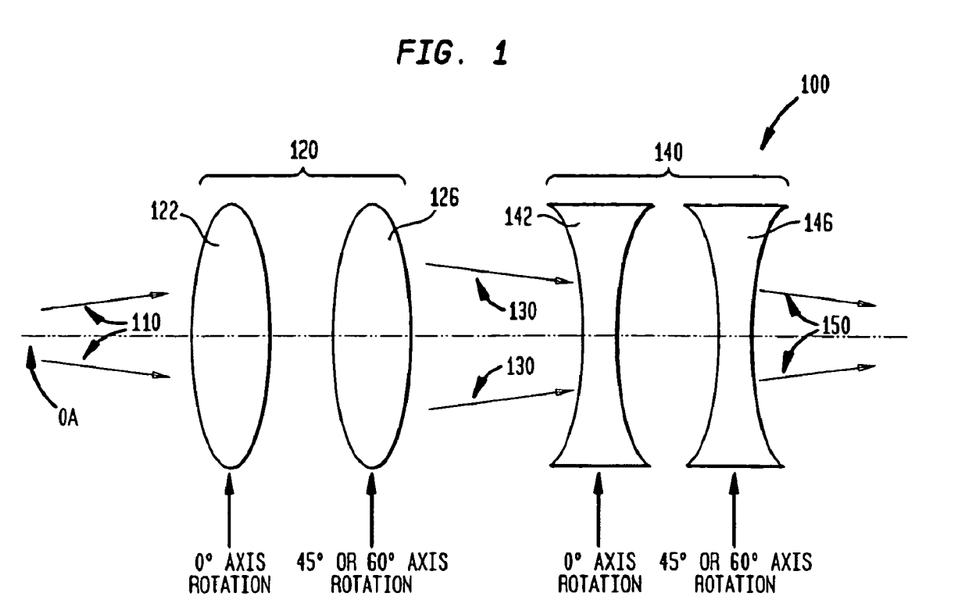
FIG. 1 is a cross-sectional view of an optical system with corrected intrinsic birefringence according to an embodiment of the present invention.

FIG. 1 is a cross-sectional view of an optical system 100 with corrected intrinsic birefringence according to an embodiment of the present invention. Optical system 100 includes two pairs 120, 140 of optical elements arranged along an optical axis OA. Pair 120 includes a pair of birefringence-compensating optical elements 122, 126. Optical elements 122, 126 are made up of calcium fluoride having a <111> crystal orientation. The crystal axis of optical element 122 is set at an angle of approximately 0 degrees. The crystal axis of optical element 126 is set at an angle of approximately 60 degrees. In this way, the crystal axes of pair 120 are rotated by an approximately 60 degree angle with respect each other to correct for intrinsic birefringence. Likewise, pair 140 includes a pair of birefringence-compensating optical elements 142,146. Optical elements 142, 146 are made up of calcium fluoride having a <111> crystal orientation. The crystal axis of optical element 142 is set at an angle of approximately 0 degrees. The crystal axis of optical element 146 is set at an angle of approximately 60 degrees. In this way, the crystal axes of pair 140 are rotated by an approximately 60 degree angle with respect each other to correct for intrinsic birefringence.

In another example, optical elements 122, 126 are made up of calcium fluoride having a <100> crystal orientation. The crystal axis of optical element 122 is set at an angle of approximately 0 degrees. The crystal axis of optical element 126 is set at an angle of approximately 45 degrees. Optical elements 142, 146 are made up of calcium fluoride having a <100> crystal orientation. The crystal axis of optical element 142 is set at an angle of approximately 0 degrees, and optical element 146 is set at an angle of approximately 45 degrees.

Relative angles of 60 degrees or 45 degrees between two crystal axes in a pair is illustrative and not intended to limit the present invention. Other angles can be used to correct for intrinsic birefringence depending upon a particular application (i.e., the wavelength of light, the particular fluoride, combination of fluorides, or other materials used in the optical elements, or other design considerations).

According to a feature of the present invention, intrinsic birefringence is further corrected by providing pairs 120, 140 having a type of refractive power (positive or negative) and a sign of intrinsic birefringence values (positive or negative). The type of refractive power and the sign of the intrinsic birefringence of the pairs of optical elements are balanced or selected to correct for intrinsic birefringence. In embodiments, pairs 120,140 include opposite refractive powers (positive and negative), and same sign intrinsic birefringence values (positive or negative). In other embodiments, pairs 120, 140 have the same type of refractive powers (positive or negative), while intrinsic birefringence values have different signs (positive and negative).

In the example of FIG. 1, pair 120 has a positive refractive power and pair 140 has a negative refractive power. In one example, optical elements 122, 126 are each double convex lenses having positive refractive power, while optical elements 142, 146 are each double concave lenses having negative refractive power. Pair 120 and pair 140 are also made up of calcium fluoride and have the same positive sign intrinsic birefringence value or the same negative sign intrinsic birefringence value. Alternatively, pair 120 and pair 140 can be made up of barium fluoride and have the same positive or negative sign intrinsic birefringence value. This combination of crystal axis rotation, optical materials with same sign intrinsic birefringence values, and opposing positive and negative refractive powers used in a set of four elements provides an improved correction of intrinsic birefringence than the limited two rotated optical elements used in a conventional approach.

As shown in FIG. 1, optical system 100 acts as an optical reduction system. An input beam 110 (such as a UV exposure beam at 193 nm or 157 nm) is reduced by pair 120 to form beam 130. Beam 130 is further reduced by pair 140 to form an output reduced beam 150. This reduction can be carried using fluoride optical materials, which are transparent to UV but highly birefringent, since the four element system corrects for the high degree of intrinsic birefringence in the fluoride materials. Such an improved correction of intrinsic birefringence is especially important in UV microlithography where optical materials with a high degree of intrinsic birefringence, such as, calcium fluoride and barium fluoride, are desired to be used in an optical reduction system.

The four optical elements 122, 126, 142, 146 making up the two pairs 120, 140 can be arranged in any order along optical axis OA. FIG. 1 shows one example where the first through fourth optical elements 122, 126, 142, 146 are arranged in the following order: first optical element 122, second optical element 126, third optical element 142, and then the fourth optical element 146 (i.e., double convex lens, double convex lens, double concave lens, and double concave lens). An example of a different order of elements is described with respect to FIG. 2.

Figure 2:
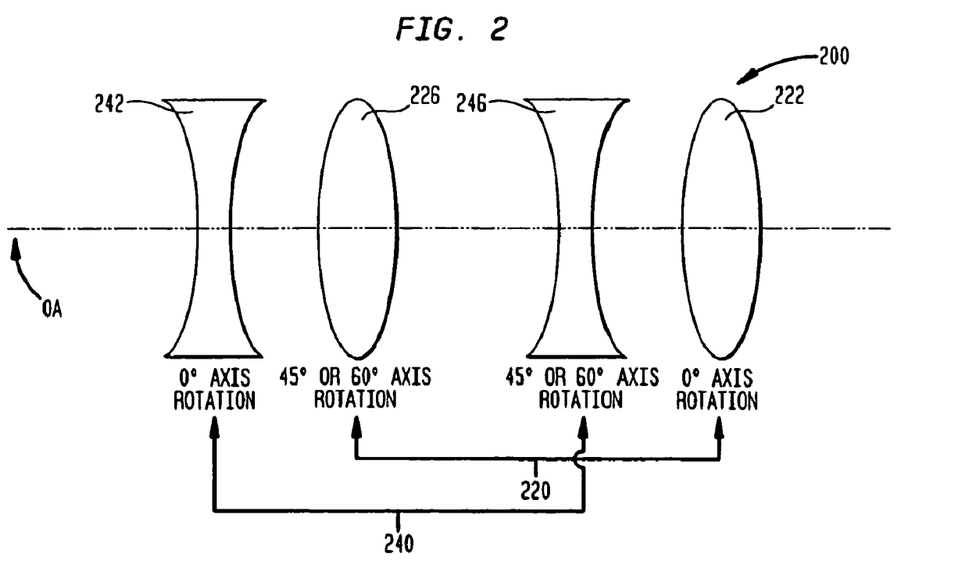
FIG. 2 is a cross-sectional view of an optical system with corrected intrinsic birefringence according to an embodiment of the present invention.

FIG. 2 is a cross-sectional view of an optical system 200 with corrected intrinsic birefringence according to another embodiment of the present invention. Optical system 200 includes two pairs 220, 240 of optical elements arranged along an optical axis OA. Pair 220 includes a pair of two birefringence-compensating optical elements 222, 226. Optical elements 222, 226 are made up of calcium fluoride having a <100> or <111> crystal orientation. The crystal axis of optical element 222 is set at an angle of approximately 0 degrees. The crystal axis of optical element 226 is set at an angle of approximately 60 degrees for a <111> orientation or 45 degrees for a <100> orientation. In this way, the crystal axes of pair 220 are rotated with respect to each other to correct for intrinsic birefringence. Likewise, pair 240 includes a pair of two birefringence-compensating optical elements 242, 246. Optical elements 242, 246 are made up of calcium fluoride having a <100> or <111> crystal orientation. The crystal axis of optical element 242 is set at an angle of approximately 0 degrees. The crystal axis of optical element 246 is set at an angle of approximately 60 degrees for a <111> orientation or 45 degrees for a <100> orientation. In this way, the crystal axes of pair 240 are rotated with respect to each other to correct for intrinsic birefringence. In the example of FIG. 2, optical elements 222, 226 are each double convex lenses having positive refractive power, while optical elements 242, 246 are each double concave lenses having negative refractive power. The intrinsic birefringence values of elements 222, 226, 242, 246 are the same sign. In FIG. 2, the first through fourth optical elements 222, 226, 242, 246 are arranged in the following order: third optical element 242, second optical element 226, fourth optical element 246, and then the first optical element 222 (i.e., double concave lens, double convex lens, double concave lens, and double convex lens).

EXAMPLES

Listed below are tables describing characteristics of two pair birefringence-compensating optical systems according to example implementations of the present invention. The tables are illustrative and not intended to limit the present invention.

A. Different Refractive Power Type, Same Sign Intrinsic Birefringence

TABLE A(1)

| Optics | Material | Crystal Orientation | Relative Angle of Rotation within Pair | Intrinsic Birefr. Sign ± | Refractive Power (+ or −) |
|---|---|---|---|---|---|
| First Pair | $CaF_2$ | <100> | 45° C. | + | + |
| Second Pair | $CaF_2$ | <100> | 45° C. | + | − |

TABLE A(2)

| Optics | Material | Crystal Orientation | Relative Angle of Rotation within Pair | Intrinsic Birefr. Sign ± | Refractive Power (+ or −) |
|---|---|---|---|---|---|
| First Pair | $CaF_2$ | <111> | 60° C. | − | + |
| Second Pair | $CaF_2$ | <111> | 60° C. | − | − |

B. Same Refractive Power Type, Opposite Sign Intrinsic Birefringence

TABLE B(1)

| Optics | Material | Crystal Orientation | Relative Angle of Rotation within Pair | Intrinsic Birefr. Sign ± | Refractive Power (+ or −) |
|---|---|---|---|---|---|
| First Pair | $CaF_2$ | <100> | 45° C. | + | + |
| Second Pair | $BaF_2$ | <100> | 45° C. | − | + |

TABLE B(2)

| Optics | Material | Crystal Orientation | Relative Angle of Rotation within Pair | Intrinsic Birefr. Sign ± | Refractive Power (+ or −) |
|---|---|---|---|---|---|
| First Pair | $CaF_2$ | <100> | 45° C. | + | + |
| Second Pair | $CaF_2$ | <111> | 60° C. | − | + |

The present invention has been described with respect to optical elements made up of a fluoride material such as calcium fluoride and barium fluoride. Any fluoride can be used having a high or low refractive index. Other examples of material which can be used are the following high refractive index fluorides: gadolinium tri-fluoride ($GdF_3$), lanthanum tri-fluoride ($LaF_3$), samarium fluoride ($SmF_3$), europium fluoride ($EuF_3$), terbium fluoride ($TbF_3$), dysprosium fluoride ($DyF_3$), holmium fluoride ($HoF_3$), erbium fluoride ($ErF_3$), thulium fluoride ($TmF_3$), ytterbium fluoride ($YbF_3$), lutetium fluoride ($LuF_3$), zirconium fluoride ($ZrF_4$), hafnium fluoride ($HfF_4$), yttrium fluoride ($YF_3$), neodymium fluoride ($NdF_3$), any of the other lanthanide series tri-fluorides, metallic fluorides, or other high index, ultraviolet transparent material. Other examples of material which can be used are the following low refractive index fluorides: magnesium fluoride ($MgF_2$), aluminum tri-fluoride ($AlF_3$), strontium fluoride ($SrF_2$), lithium fluoride (LiF), and sodium fluoride (NaF), or other low index, ultraviolet transparent material.

Intrinsic birefringence corrected optical systems 100, 200 can be used in any type of optical system. In one application of the present invention, optical systems 100, 200 are used in an optical reduction system in a UV microlithography exposure system. Any type of optical reduction system can include intrinsic birefringence corrected optical systems 100, 200 according to the present invention. Examples of optical reduction systems (also called projection optics) include a catadioptric optical reduction system and a refractive optical reduction system.

Figure 3:
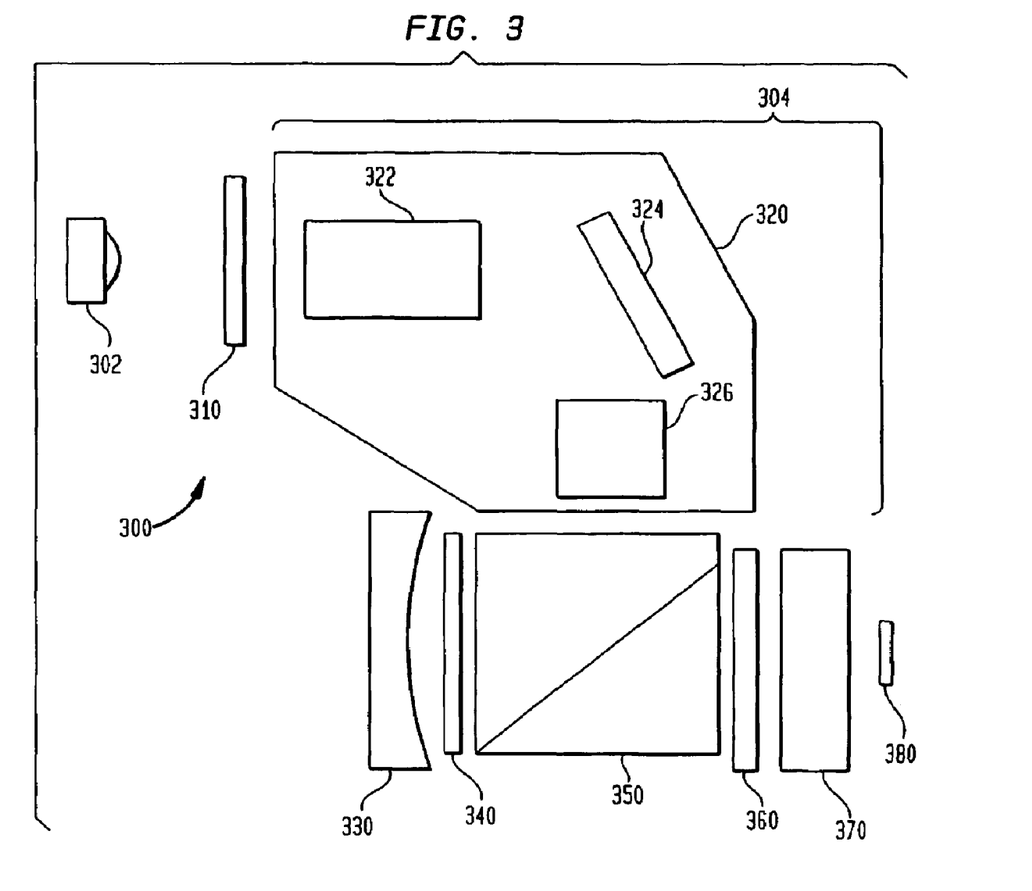
FIG. 3 is a cross-sectional view of an example exposure system that includes a catadioptric reduction system using the optical system with corrected intrinsic birefringence according to an embodiment of the present invention.

Example Catadioptric Optical Reduction System Using Intrinsic Birefringence Corrected Optical System FIG. 3 is a diagram of an example exposure system 300 according to an embodiment of the present invention. Exposure system 300 includes a light source 302, reticle 310, catadioptric optical reduction system 304, and wafer 380. Alignment and step and scan stages and other mechanical components are omitted for clarity. Light source 302 emits an exposure light at an ultraviolet wavelength, preferably at 193 nm or 157 nm.

During exposure, light emitted from source 302 passes through reticle 310 to catadioptric optical reduction system 304. Catadioptric optical reduction system 304 reduces the image of the reticle (or part of the reticle in a step and scan system) by a predetermined ratio, such as, 4:1. A reduced reticle image is output from catadioptric optical reduction system 304 onto wafer 380.

Catadioptric optical reduction system 304 includes a truncated UV polarizing beam splitter cube 350. Other components in catadioptric optical reduction system 304 include a lens unit 320 (having a first lens group 322, folding mirror 324, and a second lens group 326), a first quarter-wave plate 340, a concave mirror 330, a second quarter-wave plate 360, and a third lens group 370. Folding mirror 324 is optional; however, the folding mirror permits the object and image planes to be parallel which is convenient for one intended application of the optical system of the present invention, which is the manufacture of semiconductor devices using photolithography with a step and scan system.

Radiation (also called light) from light source 302 passes through reticle 310, enters the first lens group 322, reflects from the folding mirror 324, and passes through the second lens group 326. The radiation enters the UV polarizing beamsplitter cube 350. In one embodiment, this radiation is linearly polarized in one polarization state (e.g. S polarization) prior to entry into the UV polarizing beamsplitter cube 350 to minimize loss and maximize transmission efficiency through the optical reduction system 304. UV polarizing beamsplitter cube 350 then reflects the linearly polarized light in one polarized state toward quarter-wave plate 340 and concave mirror 330. The light reflecting from concave mirror returns through quarter-wave plate 340 and is then shifted to the other polarization state (e.g., P polarization) that cube 350 transmits. The light then passes through quarter-wave plate 360 and lens group 370 and is focused at the wafer 380 at image or wafer plane. See, J. McClay et al., "Ultraviolet Polarization Beam Splitter for Microlithography" U.S. application Ser. No. 09/538,529, filed Mar. 30, 2000 now U.S. Pat. No. 6,480,330, issued Nov. 12, 2002, and incorporated by reference in its entirety herein.

According to a feature of the invention, intrinsic birefringence corrected optical systems 100, 200 can be used anywhere along the optical path between mask 310 and wafer 380. In other words, lenses 122, 126, 142, 146 can be located and distributed at different locations in any order anywhere along the optical path between mask 310 and wafer 380. For example, the lenses in intrinsic birefringence corrected optical systems 100, 200 can be used as lenses in any one of first to third lens groups 322, 326, 370 or in any combination the first to third lens groups 322, 326, 370.

Methods

The present invention also provides methods for correcting for intrinsic birefringence. In one embodiment, a method for correcting for intrinsic birefringence includes the step of disposing two pairs of birefringence-compensating optical elements along an optical path. Each pair of birefringence-compensating optical elements has optical elements rotated by an angle of approximately 60 or 45 degrees. The two pairs have refractive power type and intrinsic birefringence sign values (or different refractive indices) balanced or selected to correct for intrinsic birefringence. In another embodiment, a semiconductor fabrication method for expos-ing a wafer with an image representative of a pattern on a mask includes the steps of illuminating the mask with an exposure light, and projecting and reducing the exposure light transmitted from the illuminated mask toward the wafer. The projecting and reducing step includes correcting for intrinsic birefringence in the optical path. Such correcting can include passing light through two pairs of birefringence-compensating optical elements as described above with respect to FIGS. 1–3.

Figure 4A:
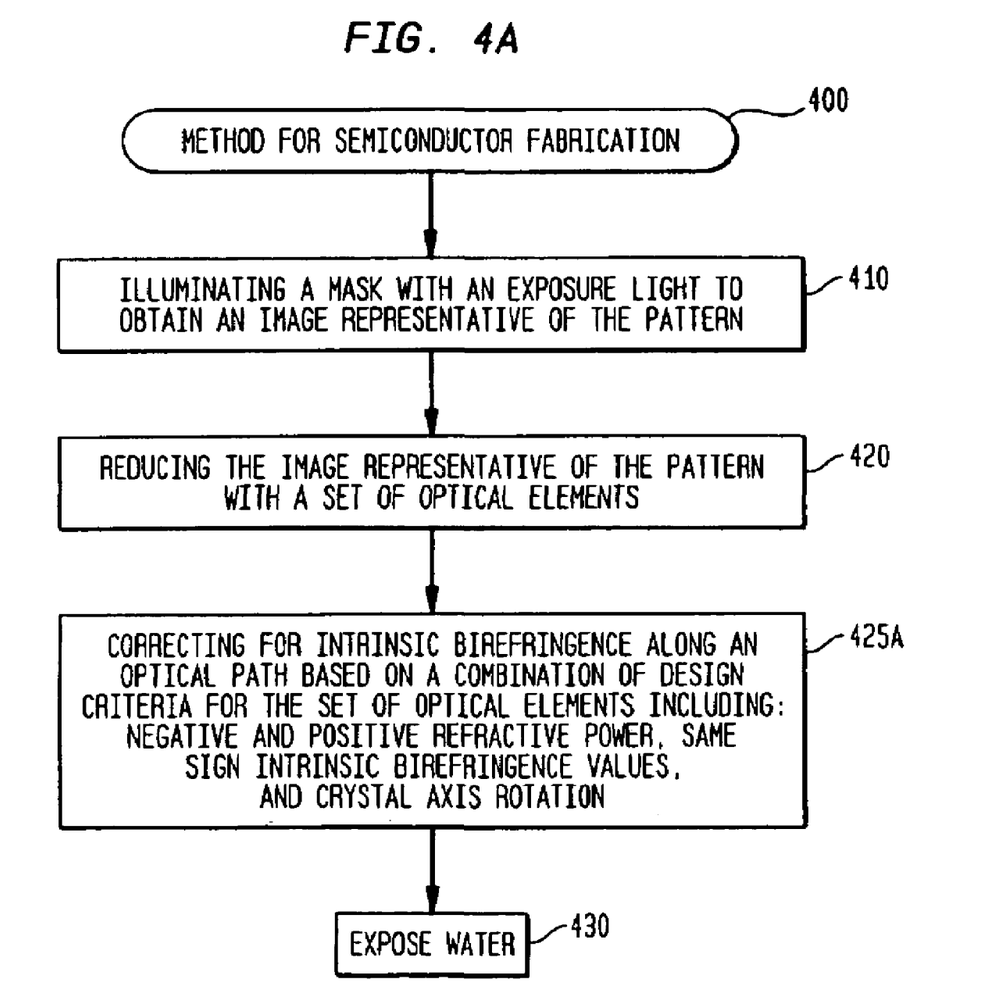
FIG. 4A is a flowchart of a semiconductor fabrication method that includes correcting intrinsic birefringence according to an embodiment of the present invention.

FIG. 4A is a flowchart of a semiconductor fabrication method 400 that includes correcting intrinsic birefringence according to an embodiment of the present invention (steps 410–430). Semiconductor fabrication method 400 includes illuminating a mask with an exposure light to obtain an image representative of the pattern (step 410), and reducing the image representative of the pattern with a set of optical elements (step 420). Reducing step 420 includes correcting for intrinsic birefringence along an optical path based on a combination of design criteria for the set of optical elements including: negative and positive refractive power, same sign intrinsic birefringence values, and crystal axis rotation (step 425A). In step 430, a wafer is then exposed with illumination that has been corrected for intrinsic birefringence according to the present invention.

Figure 4B:
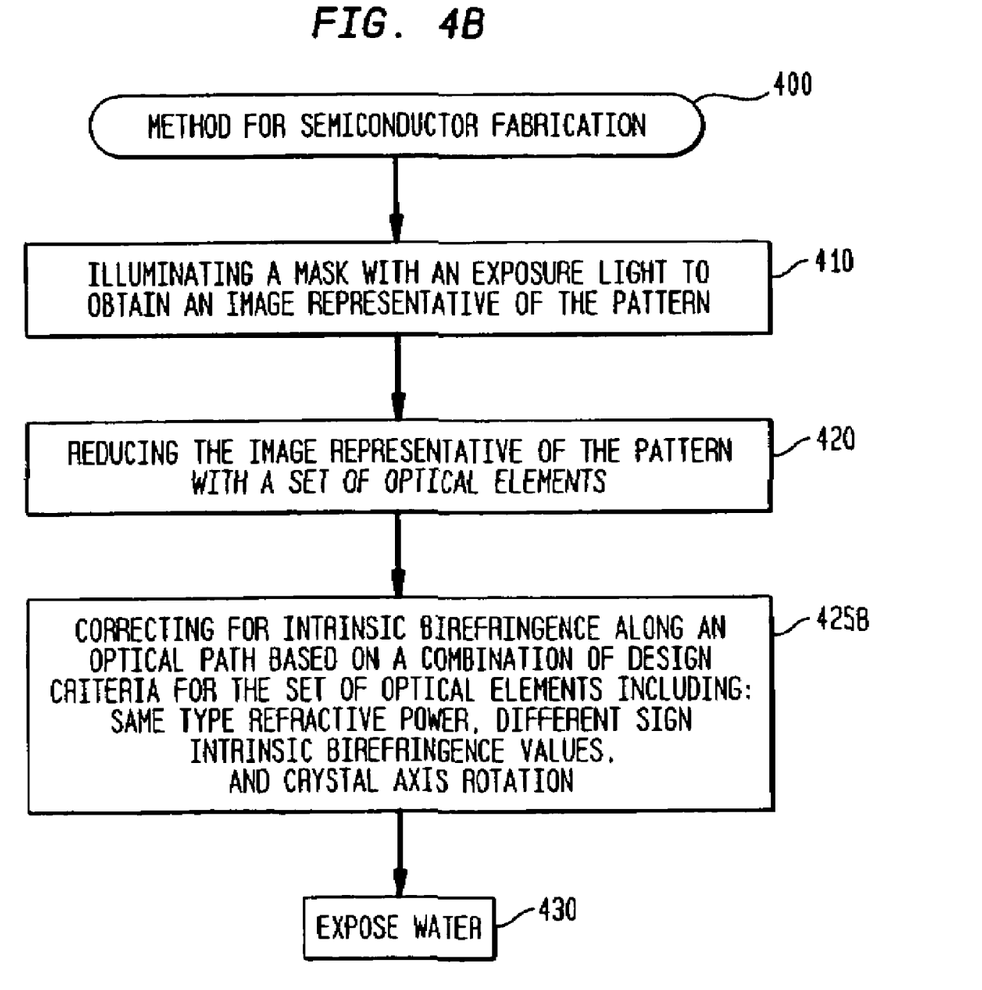
FIG. 4B is a flowchart of another semiconductor fabrication method that includes correcting intrinsic birefringence according to an embodiment of the present invention.

FIG. 4B is a flowchart of a semiconductor fabrication method 400 that includes correcting intrinsic birefringence according to an embodiment of the present invention. The method of FIG. 4B is like that of FIG. 4A, except reducing step 420 includes correcting for intrinsic birefringence along an optical path based on a combination of design criteria for the set of optical elements including: same type of refractive power, different sign intrinsic birefringence values, and crystal axis rotation (step 425B).

CONCLUSION

While specific embodiments of the present invention have been described above, it should be understood that they have been presented by way of example only, and not limitation. It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. An optical system corrected for intrinsic birefringence, comprising:

a first pair of optical elements disposed along an optical axis, said first pair including:

a first optical element made up of a first material having a first intrinsic birefringence sign and a first crystal axis; and a second optical element made up of said first material having a second intrinsic birefringence sign and a second crystal axis;

a second pair of optical elements disposed along said optical axis, said second pair including:

a third optical element made up of a second material having a third intrinsic birefringence sign and a third crystal axis; and a fourth optical element made up of said second material having a fourth intrinsic birefringence sign and a fourth crystal axis;

wherein said first material is different from said second material;

wherein said first pair of optical elements has a first type of refractive power, and said second pair of optical elements has a second type of refractive power; and wherein the first type of refractive power, the second type of refractive power and the first to fourth intrinsic birefringence signs tend to correct for intrinsic birefringence, and wherein said first and second optical elements are rotated with respect to one another such that the first crystal axis and the second crystal axis form a first angle which tends to correct for intrinsic birefringence; and wherein said third and fourth optical elements are rotated with respect to one another such that the third crystal axis and the fourth crystal axis form a second angle which tends to correct for intrinsic birefringence.

2. The optical system of claim 1, wherein said first and second materials each comprise at least one fluoride material.

3. The optical system of claim 2, wherein said first and second materials each comprise at least one of calcium fluoride and barium fluoride.

4. The optical system of claim 1, wherein said first material comprises calcium fluoride, and said second material comprises barium fluoride.

5. The optical system of claim 1, wherein said first and second materials each comprise optical material transparent to ultraviolet radiation.

6. The optical system of claim 1, wherein said first and second materials each comprise optical material transparent to ultraviolet radiation having a wavelength at or less than 157 nm.

7. The optical system of claim 1, wherein the first to fourth intrinsic birefringence signs of said first to fourth optical elements are the same sign.

8. The optical system of claim 1, wherein said first optical element and said second optical element each comprise a double convex lens, and said third optical element and said fourth optical element each comprise a double concave lenses.

9. The optical system of claim 1, wherein said first optical element and said second optical element each comprise at least one of a double convex lens, a plano-convex lens, and a convex-plano lens.

10. The optical system of claim 1, wherein said third optical element and said fourth optical element each comprise at least one of a double concave lens, a plano-concave lens, and a concave-plano lens.

11. The optical system of claim 1, wherein said first optical element and said second optical element comprise a pair of lenses each having a positive refractive power, and said third optical element and said fourth optical element comprise a pair of lenses each having a negative refractive power.

12. The optical system of claim 11, wherein said first through fourth optical elements comprise respectively a first double convex lens, a second double convex lens, a first double concave lens, and a second double concave lens.

13. The optical system of claim 1, wherein said first through fourth optical elements are arranged in any order along the optical axis.

14. The optical system of claim 13, wherein said first through fourth optical elements are arranged in the following order along the optical axis: said first optical element, said second optical element, said third optical element, and then said fourth optical element.

15. The optical system of claim 13, wherein said first through fourth optical elements are arranged in the following order along the optical axis: said third optical element, said second optical element, said fourth optical element, and then said first optical element.

16. The optical system of claim 1, wherein said first and second materials each comprise a fluoride material having a <100> orientation or a <111> orientation.

17. The optical system of claim 1, wherein said first angle and said second angle are each equal to approximately 45 degrees or approximately 60 degrees.

18. An exposure system for microlithography, comprising: an optical reduction system that includes an optical system corrected for intrinsic birefringence as recited in claim 1.

19. An optical system corrected for intrinsic birefringence, comprising:

a first pair of birefringence-compensating optical elements disposed along an optical axis and rotated relative to one another to null intrinsic birefringence; and a second pair of birefringence-compensating optical elements disposed along said optical axis and rotated relative to one another to null intrinsic birefringence, wherein said first pair is made from a first material and said second pair is made from a second material that is different from said first material;

wherein said first pair has a positive refractive power, and said second pair has a negative refractive power; and wherein an intrinsic birefringence sign of said first pair is the same as an intrinsic birefringence sign of said second pair.

20. An exposure system for microlithography, comprising: an optical reduction system that includes an optical system corrected for intrinsic birefringence as recited in claim 19.

21. An optical system corrected for intrinsic birefringence, comprising:

first through fourth optical elements disposed along an optical axis, each of the first through fourth optical elements having a respective refractive power, a respective intrinsic birefringence sign, and a respective crystal axis, wherein any two of said first through fourth optical elements are made from a first material and have a positive refractive power, and the remaining two of said first through fourth optical elements are made from a second material that is different from the first material and have a negative refractive power;

wherein said first through fourth optical elements have the same intrinsic birefringence sign; and wherein any two of said first through fourth optical elements have crystal axes aligned with respect to each other, and wherein the remaining two of said first through fourth optical elements have crystal axes aligned with respect to each other and at an angle with respect to the crystal axes of the other two of said first through fourth optical elements which nulls intrinsic birefringence.

22. A method for correcting for intrinsic birefringence comprising:

disposing two pairs of birefringence-compensating optical elements along an optical path, the two pairs being made from different materials and having angles of rotation, refractive powers and intrinsic birefringence signs that tend to correct for intrinsic birefringence.

* * * * *

UNITED STATES PATENT AND TRADEMARK OFFICE
CERTIFICATE OF CORRECTION

PATENT NO. : 7,154,669 B2  Page 1 of 1
APPLICATION NO. : 10/304995
DATED : December 26, 2006
INVENTOR(S) : Harry Sewell

It is certified that error appears in the above-identified patent and that said Letters Patent is hereby corrected as shown below:

Column 2, line 53, "barium flouride" should be replaced with --barium fluoride--.

Column 5, line 17, "microlithrography" should be replaced with --microlithography--.

Signed and Sealed this

Fifteenth Day of April, 2008

JON W. DUDAS
*Director of the United States Patent and Trademark Office*